(12) United States Patent
Jain et al.

(10) Patent No.: US 10,163,477 B1
(45) Date of Patent: Dec. 25, 2018

(54) MEMORY ARRAY HAVING DISTURB DETECTOR AND WRITE ASSISTOR

(71) Applicant: TAIWAN SEMICONDUCTOR MANUFACTURING COMPANY LTD., Hsinchu (TW)

(72) Inventors: Sanjeev Kumar Jain, Ontario (CA); Ali Taghvaei, Ontario (CA); Atul Katoch, Kanata (CA)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/656,887

(22) Filed: Jul. 21, 2017

Related U.S. Application Data

(60) Provisional application No. 62/523,514, filed on Jun. 22, 2017.

(51) Int. Cl.
*G11C 8/00* (2006.01)
*G11C 7/24* (2006.01)
*G11C 8/10* (2006.01)

(52) U.S. Cl.
CPC .................. *G11C 7/24* (2013.01); *G11C 8/10* (2013.01)

(58) Field of Classification Search
CPC .................................... G11C 7/24; G11C 8/10

USPC ....................................... 365/230.05, 189.04
See application file for complete search history.

(56) References Cited

U.S. PATENT DOCUMENTS

| 9,183,947 B1 | 11/2015 | Katoch |
| 9,208,856 B2* | 12/2015 | Pelley .................. G11C 11/418 |
| 9,208,858 B1* | 12/2015 | Lin ....................... G11C 11/419 |
| 2009/0052262 A1* | 2/2009 | Nii ........................... G11C 8/08 |
| | | 365/189.14 |
| 2015/0138903 A1 | 5/2015 | O'Connell et al. |

* cited by examiner

*Primary Examiner* — Vu Le
(74) *Attorney, Agent, or Firm* — WPAT, P.C., Intellectual Property Attorneys; Anthony King

(57) ABSTRACT

A memory array having a first port and a second port is disclosed. The memory array includes: a first memory cell, wherein access to the first memory cell through the first port is controlled by a first word line, and access to the first memory cell through the second port is controlled by a second word line; a second memory cell, wherein access to the second memory cell through the first port is controlled by the first word line, and access to the second memory cell through the second port is controlled by the second word line; and a disturb detector, used to generate a disturb detected signal for indicating whether the first memory cell and the second memory cell are accessed at a same time. A memory array having a write assistor is also disclosed.

20 Claims, 9 Drawing Sheets

MEMORY ARRAY HAVING DISTURB DETECTOR AND WRITE ASSISTOR

CROSS REFERENCE TO RELATED APPLICATIONS

This application claims the benefit of U.S. provisional application 62/523,514, filed on Jun. 22, 2017, which is incorporated by reference in its entirety.

BACKGROUND

A multi-port memory cell provides independent data channels or ports that enable a read or a write operation on each port to addresses asynchronously from each other. For illustration, one port, such as a port P_A, is write accessed while the other port, such as a port P_B, is dummy read accessed. A dummy read refers to a scenario, in which the memory cell is not read accessed, but various signals cause the memory cell to be in a read-like condition and the data for reading is not reliable. Generally, the dummy read from port P_B increases a load on a storage node of the memory cell to be written, and thus prolongs the write time from port P_A. Stated differently, the write operation from port P_A is write disturbed by the dummy read from port P_B. In various approaches, the write disturb is detected based on circuitry that uses a match address of port P_A and port P_B.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
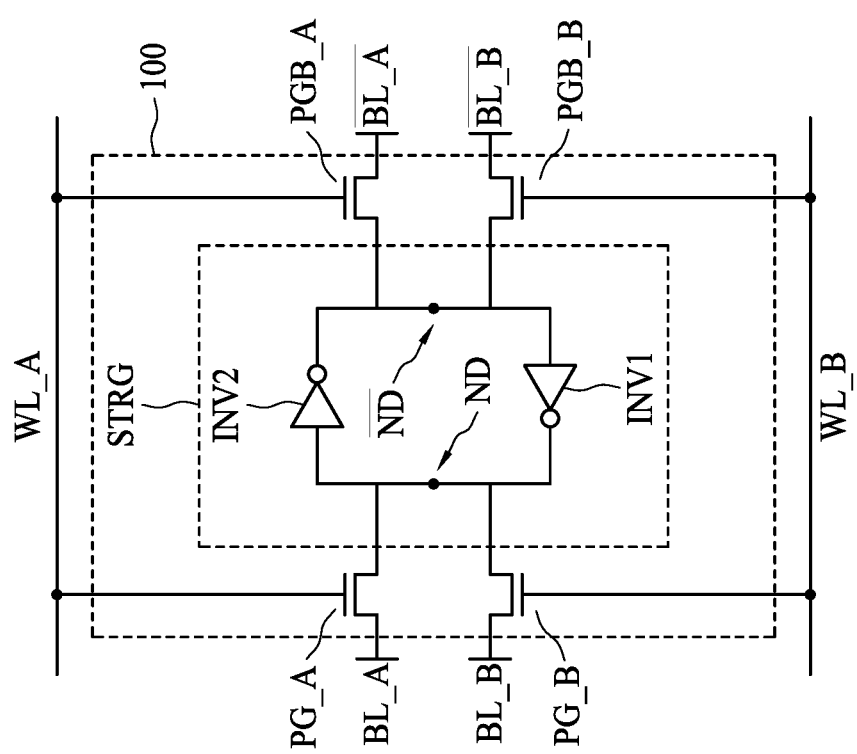
FIG. 1 is a diagram of a dual port memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Memory Cell

FIG. 1 is a diagram of a dual port memory cell 100 in accordance with some embodiments of the present disclosure. The dual port memory cell 100 includes a storage area STRG with two storage nodes ND and $\overline{\text{ND}}$ for storing data. The node ND is at an output of an inverter INV1, and the node $\overline{\text{ND}}$ is at an output of an inverter INV2. The inverters INV1 and INV2 are cross-coupled, i.e. the output of the inverter INV1 is coupled to an input of the inverter INV2, and the output of the inverter INV2 is coupled to an input of the inverter INV1. The node ND is associated with transistors, pass gates, or transmission gates PG_A and PG_B, and the node $\overline{\text{ND}}$ is associated with transistors, pass gates, or transmission gates PGB_A and PGB_B. In particular, the transmission gate PG_A is configured as a switch to enable or disable a connection between the node ND and a bit line BL_A; the transmission gate PG_B is configured as a switch to enable or disable a connection between the node ND and a bit line BL_B; the transmission gate PGB_A is configured as a switch to enable or disable a connection between the node $\overline{ND}$ and a bit line $\overline{BL\_A}$, where the bit line $\overline{BL\_A}$ is a logically inverted signal of the bit line BL_A; the transmission gate PGB_B is configured as a switch to enable or disable a connection between the node $\overline{ND}$ and a bit line $\overline{BL\_B}$, where the bit line $\overline{BL\_B}$ is a logically inverted signal of the bit line BL_B. By operation of the dual port memory cell 100, a logical value of the node ND or the node $\overline{ND}$ is an inverse of one another.

A word line WL_A and a pair of pass gates PG_A and PGB_A form a first read-write port, which, for illustration, is called a port A (not labeled). A word line WL_B and a pair of pass gates PG_B and PGB_B form a second read-write port, which, for illustration, is called a port B (not labeled). When the dual port memory cell 100 is write accessed using the first port A, for example, data to be written to the dual port memory cell 100 is applied to the bit lines BL_A and $\overline{BL\_A}$ at a drain of corresponding pass gates PG_A and PGB_A. The word line WL_A is then activated (in this embodiment, with a high logical value 1′b1) to turn on the pass gates PG_A and PGB_A. As a result, the data on the bit line BL_A is transferred through the pass gate PG_A to the node ND, and the data on the bit line $\overline{BL\_A}$ is transferred through the pass gate PGB_A to the node ND. For another example, when the dual port memory cell 100 is read accessed using the first port A, the bit lines BL_A and $\overline{BL\_A}$ are charged to a high logical value 1′b1. The word line WL_A is then activated (in this embodiment, with a high logical value 1′b1) to turn on the pass gates PG_A and PGB_A. As a result, the data on the node ND is transferred to the bit line BL_A, and the data on node $\overline{ND}$ is transferred to the bit line $\overline{BL\_A}$. The data on the bit lines BL_A and $\overline{BL\_A}$ is then processed to reveal the data on corresponding nodes ND and $\overline{ND}$. Operations of the port P are similar to those of port P. Please note that the activation of the word line WL_A may not necessarily mean to activate the word line WL_A to a high logical value 1′b1. In some embodiment, the word line WL_A may be activated with a low logical value 1′b0, and associated circuits may be modified accordingly. Such a modification may also be applied to any part or the entire part of the present disclosure. In other words, the configuration of high active or low active may be interchangeable.

In some embodiments, word lines WL_A and WL_B are each coupled to a plurality of the dual port memory cells 100 in a row of a memory array. Further, bit lines BL_A and $\overline{BL\_A}$ are each coupled to a plurality of the dual port memory cells 100 in a column of the memory array. Similarly, bit lines BL_B and $\overline{BL\_B}$ are each coupled to plurality of the dual port memory cells 100 in the same column of bit lines BL_A and $\overline{BL\_A}$. Word lines WL_A and WL_B are each also called a control line because word lines WL_A and WL_B control operations of corresponding pass gates PG_A, PGB_A, PG_B, and PGB_B. Bit lines BL_A, $\overline{BL\_A}$, BL_B, and $\overline{BL\_B}$ are each also called a data line because bit lines BL_A, $\overline{BL\_A}$, BL_B, and $\overline{BL\_B}$ each carry data for the dual port memory cell 100.

Please note that the dual port memory cell 100 shown as having two ports is for illustrative purpose only. In some embodiments, a memory cell having more than two ports is within the contemplated scope of the present disclosure.

Memory Array

Figure 2:
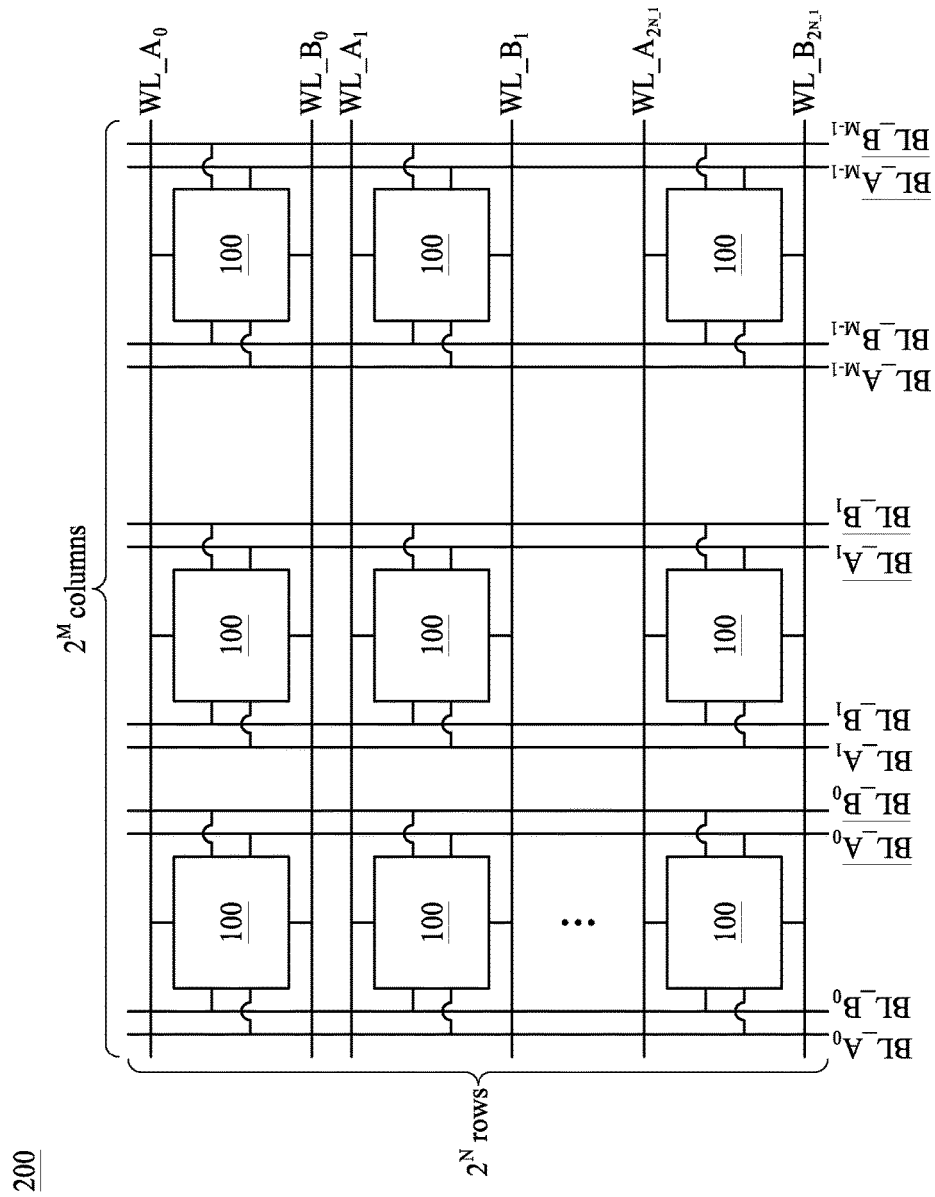
FIG. 2 is a diagram of a memory array of a plurality of dual port memory cells in FIG. 1 in accordance with some embodiments of the present disclosure.

FIG. 2 is a diagram of a memory array 200 of a plurality of dual port memory cells 100 in FIG. 1 in accordance with some embodiments of the present disclosure. To facilitate ensuing discussion, the memory array 200 includes $2^M$ columns and $2^N$ rows of the dual port memory cells 100, where M and N are positive integers. However, this is for illustration purpose only and not a limitation of the present disclosure.

A word line $WL\_A_0$ is associated with the port A of each dual port memory cell 100 in the first row of the memory array 200. A word line $WL\_B_0$ is associated with the port B of each dual port memory cell 100 in the first row of the memory array 200. A word line $WL\_A_1$ is associated with the port A of each dual port memory cell 100 in the second row of the memory array 200. A word line $WL\_B_1$ is associated with the port B of each dual port memory cell 100 in the second row of the memory array 200, and so on. Therefore, there are $2^N$ word lines $WL\_A_0$ to $WL\_A_{2^{N-1}}$ and $2^N$ word lines $WL\_B_0$ to $WL\_B_{2^{N-1}}$ or controlling the $2^N$ rows of the dual port memory cells 100.

Bit lines $BL\_A_0$ and $\overline{BL\_A_0}$ are associated with the port A of each dual port memory cell 100 in the first column of the memory array 200. Bit lines $BL\_B_0$ and $\overline{BL\_B_0}$ are associated with the port B of each dual port memory cell 100 in the first column of the memory array 200. Bit lines $BL\_A_1$ and $\overline{BL\_A_1}$ are associated with the port A of each dual port memory cell 100 in the second column of the memory array 200. Bit lines $BL\_B_1$ and $\overline{BL\_B_1}$ are associated with the port B of each dual port memory cell 100 in the second column of the memory array 200, and so on. Therefore, there are $2^M$ sets of bit lines $BL\_A_0$ and $\overline{BL\_A_0}$ to $BL\_A_{2^{M-1}}$ and $\overline{BL\_A_{2^{M-1}}}$, and $2^M$ sets of bit lines $BL\_B_0$ and $\overline{BL\_B_0}$ to $BL\_B_{2^{M-1}}$ and $\overline{BL\_B_{2^{M-1}}}$ for controlling the $2^M$ columns of the dual port memory cells 100.

For further illustration, when a write operation is required to be performed upon the dual port memory cell 100 disposed at the first row and the first column through the port A, the word line $WL\_A_0$ is controlled to be asserted (e.g., to a high logical value 1′b1). If at the same time, a read operation is required to be performed upon the dual port memory cell 100 disposed at the second column (or any other column other than the first column) of the same row (i.e. the first row) through the port B, the word line $WL\_B_0$ is controlled to be asserted (e.g., to a high logical value 1′b1) as well. The assertion of the word line $WL\_B_0$ also turns on the port B of the dual port memory cell 100 disposed at the first row and the first column and cause a dummy read to affect the write operation. This situation is called a write disturb.

In various embodiments of the present disclosure, the write disturb could occur when two memory cells in a same row are accessed at the same time. In various embodiments, mechanisms are provided to detect the same row access event and improve the write margin.

Memory Cell With Improved Write Margin

Figure 3:
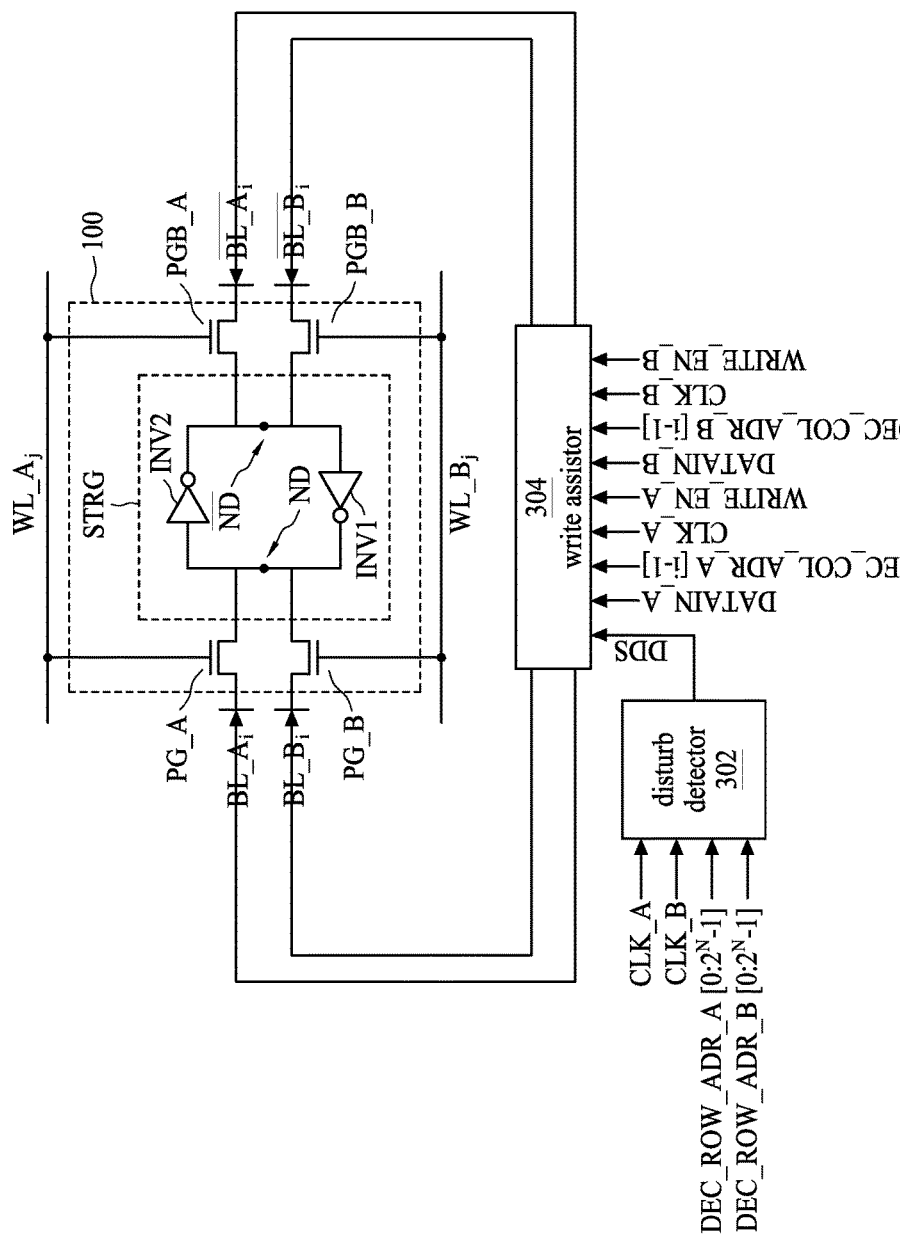
FIG. 3 is a diagram of a dual port memory cell of the memory array with circuits for improving write margin in accordance with some embodiments of the present disclosure.

FIG. 3 is a diagram of a dual port memory cell 100 of the memory array 200 with circuits for improving write margin in accordance with some embodiments of the present disclosure. In various embodiments of the present disclosure, a write disturb of the dual port memory cell 100 is detected by a disturb detector 302 and compensated by a write assistor 304. For the sake of conciseness, only one dual port memory cell 100 located at the $i_{th}$ column and the $j_{th}$ row is depicted in FIG. 3, where i and j are positive integers. When applying the disturb detector 302 and the write assistor 304 in the memory array 200 having $2^M$ column and $2^N$ rows, each dual port memory cell 100 in the memory array 200 requires a corresponding write assistor 304. The disturb detector 302, however, can be shared by all the dual port memory cells 100 of the memory array 200 and no need to be replicated.

The disturb detector 302 includes input terminals for receiving internal clocks CLK_A and CLK_B of the port A and port B, respectively. In some embodiments, the internal clocks CLK_A and CLK_B may be generated based on external clocks of the port A and port B and a chip enable signal. The internal clocks CLK_A and CLK_B may be triggered based on a rising edge of the external clocks of the port A and port B, respectively. In some embodiments, the internal clocks CLK_A and CLK_B may be triggered based on a falling edge of the external clocks of the port A and port B, respectively.

Figure 4:
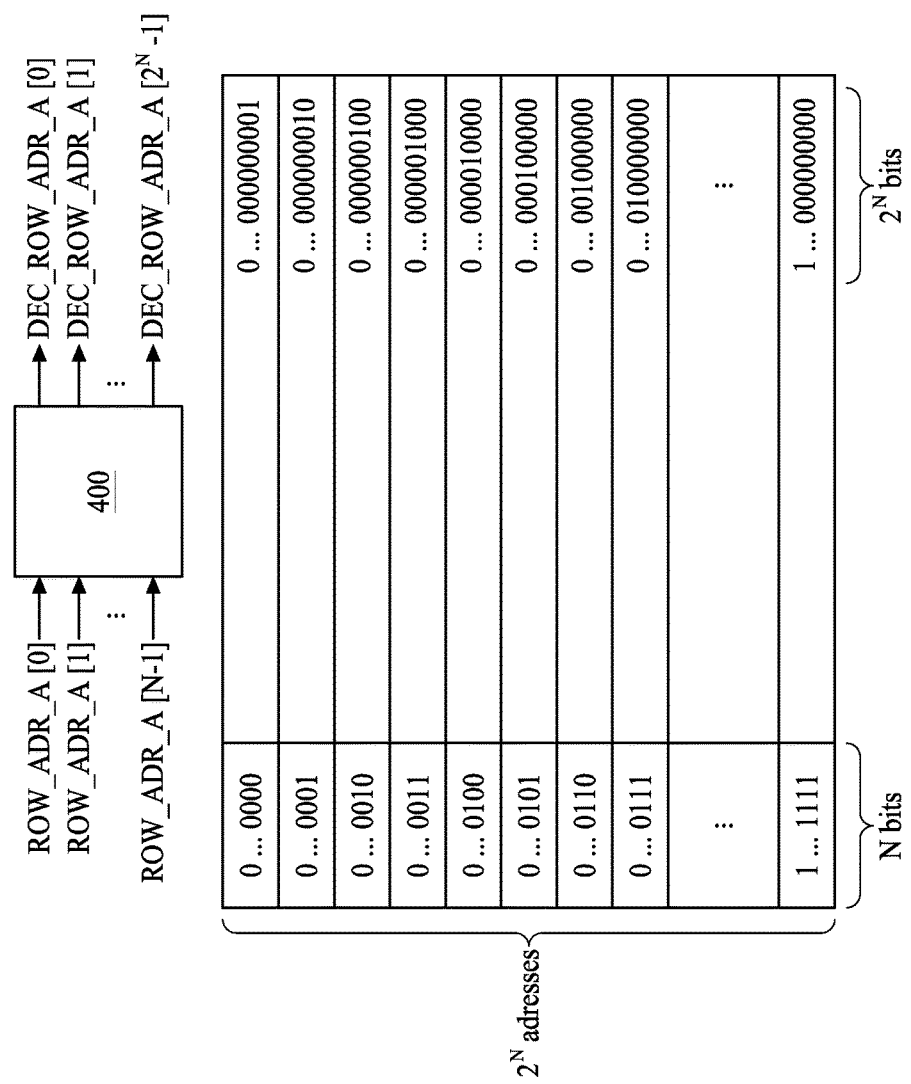
FIG. 4 is a diagram of an N to $2^N$ decoder in accordance with some embodiments of the present disclosure.

The disturb detector 302 further includes input terminals for receiving decoded row address DEC_ROW_ADR_A $[0:2^N-1]$ of the port A and decoded row address DEC_ROW_ADR_B $[0:2^N-1]$ of the port B. The decoded row address DEC_ROW_ADR_A $[0:2^N-1]$ is generated from a row address ROW_ADR_A [0:N-1], and the decoded row address DEC_ROW_ADR_B $[0:2^N-1]$ is generated from a row address ROW_ADR_B [0:N-1]. Please refer to FIG. 4. FIG. 4 is a diagram of an N to $2^N$ decoder 400 in accordance with some embodiments of the present disclosure. In the present embodiment, the memory array 200 includes $2^N$ rows corresponding to row address ROW_ADR_A [0:N-1] in binary as indicated at the left side of the table shown in FIG. 4. In order to facilitate the subsequent circuit operation, the row address ROW_ADR_A [0:N-1] is transformed into the decoded non-binary row address DEC_ROW_ADR_A $[0:2^N-1]$. Each of the decoded row addresses at the right side of the table shown in FIG. 4 has only one digit asserted to the high logical value 1'b1. The row address ROW_ADR_B [0:N-1] is transformed into the decoded row address DEC_ROW_ADR_B $[0:2^N-1]$ in a same way.

Referring back to FIG. 3, the disturb detector 302 includes an output terminal for outputting the generated disturb detected signal DDS to the write assistor 304 of each dual port memory cell 100 in the memory array 200. The write assistor 304 further includes input terminals for receiving an input data DATAIN_A of port A, a decoded column address DEC_COL_ADR_A [i-1] of port A, an internal clock CLK_A of port A, a write enable signal WRITE_EN_A for port A, an input data DATAIN_B of port B, a decoded column address DEC_COL_ADR_B [i-1] of port B, an internal clock CLK_B of port B, and a write enable signal WRITE_EN_B for port B. The input data DATAIN_A and DATAIN_B may be latched before input to the write assistor 304. The write enable signals WRITE_EN_A and/or WRITE_EN_B are asserted (e.g., to a high logical value 1'b1 in the embodiment) when a write operation is requested for the port A and/or port B.

Figure 5:
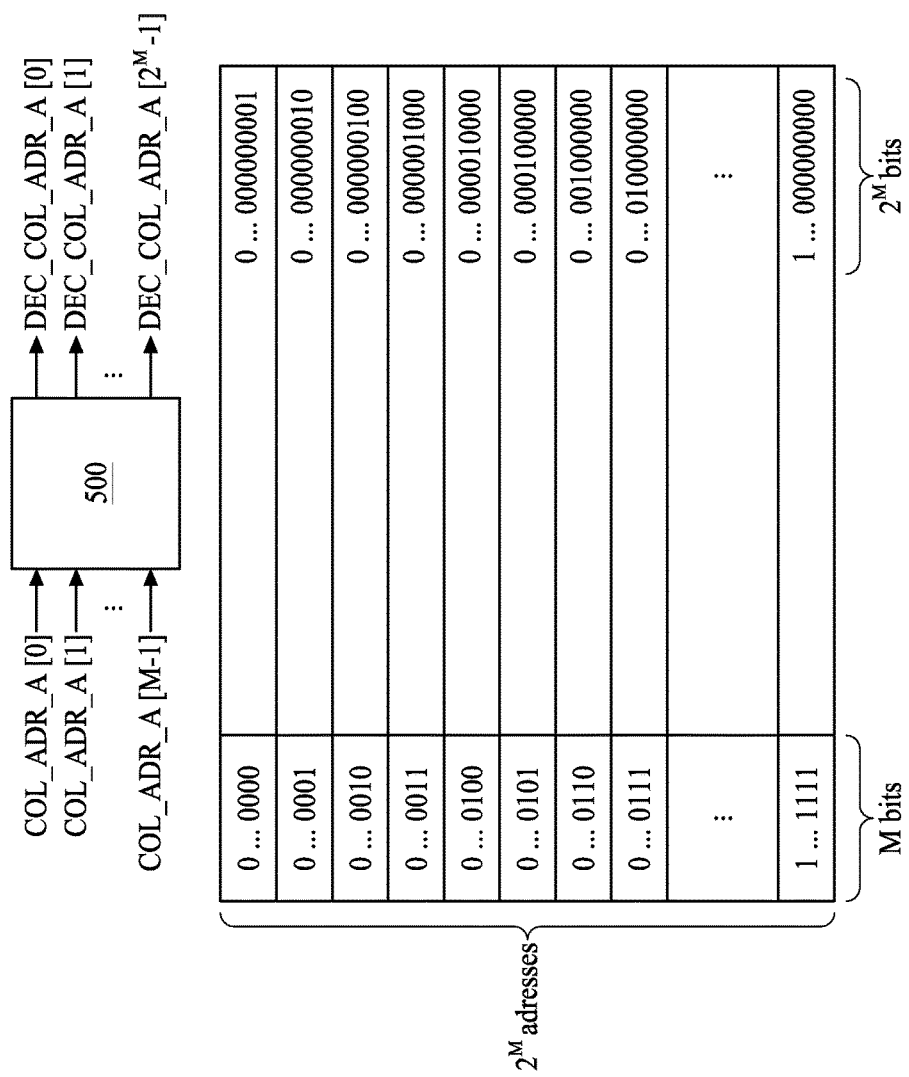
FIG. 5 is a diagram of an M to $2^M$ decoder in accordance with some embodiments of the present disclosure.

The decoded column address DEC_COL_ADR_A [i-1] is the $i_{th}$ bit from the right most bit of the decoded column address DEC_COL_ADR_A $[0:2^M-1]$. The decoded column address DEC_COL_ADR_B [i-1] is the $i_{th}$ bit from the right most bit of the decoded column address DEC_COL_ADR_B $[0:2^M-1]$. The decoded column address DEC_COL_ADR_A $[0:2^M-1]$ is generated from a column address COL_ADR_A [0:M-1], and the decoded column address DEC_COL_ADR_B $[0:2^M-1]$ is generated from a column address COL_ADR_B [0:M-1]. Please refer to FIG. 5. FIG. 5 is a diagram of an M to $2^M$ decoder 500 in accordance with some embodiments of the present disclosure. In the present embodiment, the memory array 200 includes $2^M$ columns corresponding to column address COL_ADR_A [0:M-1] in binary as indicated at the left side of the table shown in FIG. 5. In order to facilitate the subsequent circuit operation, the column address COL_ADR_A [0:M-1] is transformed into the decoded column address DEC_COL_ADR_A $[0:2^m-1]$. Each of the decoded column address DEC_COL_ADR_A $[0:2^M-1]$ has only one digit asserted, in this case, each of the decoded column address DEC_COL_ADR_A $[0:2^M-1]$ has only one high logical value 1'b1. The column address COL_ADR_B [0:M-1] is transformed into the decoded column address DEC_COL_ADR_B $[0:2^M-1]$ in a same way.

Referring back to FIG. 3, the write assistor 304 of the dual port memory cell 100 located at the $i_{th}$ column and the $j_{th}$ row of the memory array 200 further includes four output terminals coupled to the bit lines $BL\_A_i$, $BL\_B_i$, $\overline{BL\_A_i}$, $\overline{BL\_B_i}$, respectively. The write assistor 304 is able to perform the write operation at both ports (i.e. port A and pot B) of the dual port memory cell 100 located at the $i_{th}$ column and the $j_{th}$ row when a write disturb takes place (i.e. the disturb detected signal DDS is asserted). In this way, the write operation performed upon the dual port memory cell 100 located at the $i_{th}$ column and the $j_{th}$ row can be strengthened and the write margin can be improved.

Disturb Detector

Figure 6:
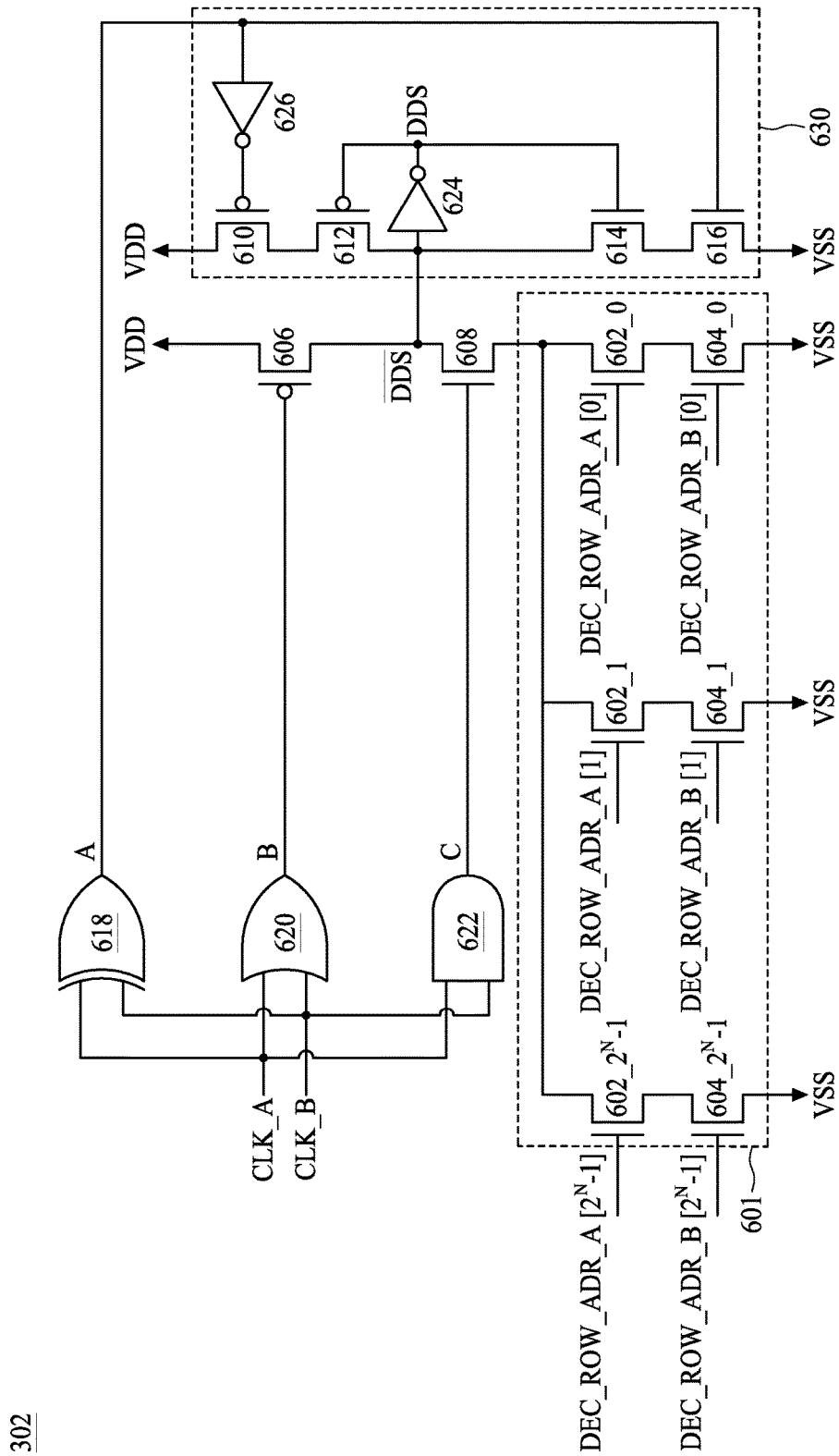
FIG. 6 is a diagram of the disturb detector with a detailed structure in accordance with some embodiments of the present disclosure.

FIG. 6 is a diagram of the disturb detector 302 with a detailed structure in accordance with some embodiments of the present disclosure. As described, the disturb detector 302 is able to detect the same row access event. Only one disturb detector 302 can be shared by all the dual port memory cells 100 of the memory array 200 having $2^M$ column and $2^N$ rows. Reference voltages VDD and VSS provide the power needed for the operation of the disturb detector 302 and the dual port memory cells 100. As is known in the art, the reference voltage VDD is higher than the reference voltage VSS. The reference voltage VDD, which, in the embodiments, is the high logical value 1'b1. The reference voltage VSS, which, in the embodiments, is the low logical value 1'b0.

The disturb detector 302 includes an address comparator 601 for comparing the row address of the port A with the row address of the port B. To put it more specific, the address comparator 601 is used to compare the decoded row address DEC_ROW_ADR_A $[0:2^N-1]$ and the decoded row address DEC_ROW_ADR_B $[0:2^N-1]$. The address comparator 601 includes NMOS transistors 602_0 to 602_$2^N$-1 and 604_0 to 604_$2^N$-1. Drains of the NMOS transistors 602_0 to 602_$2^N$-1 are coupled together. A source of the NMOS transistors 602_0 is coupled to a drain of the NMOS transistors 604_0; a source of the NMOS transistors 602_1 is coupled to a drain of the NMOS transistors 604_1, and so on. A gate of the NMOS transistors 602_0 is coupled to the first bit (i.e. bit [0]) of the decoded row addresses DEC_ROW_ADR_A $[0:2^N-1]$ of the port A; a gate of the NMOS transistors 604_0 is coupled to the first bit (i.e. bit [0]) of the decoded row addresses DEC_ROW_ADR_B $[0:2^N-1]$ of the port B. A gate of the NMOS transistors 602_1 is coupled to the second bit (i.e. bit [1]) of the decoded row addresses DEC_ROW_ADR_A $[0:2^N-1]$ of the port A; a gate of the NMOS transistors 604_1 is coupled to the second bit (i.e. bit [1]) of the decoded row addresses DEC_ROW_ADR_B $[0:2^N-1]$ of the port B, and so on. Sources of the NMOS transistors 604_0 to 604_$2^N$-1 are coupled to the reference voltage VSS.

The decoded row addresses DEC_ROW_ADR_A $[0:2^N-1]$ and DEC_ROW_ADR_A $[0:2^N-1]$ are always only one bit asserted for all the addresses as listed at the right side of the table shown in FIG. 4. Therefore, the address comparator 601 is not pulled to the voltage VSS unless the decoded row address DEC_ROW_ADR_A [0:$2^N$–1] of the port A is the same with the decoded row address DEC_ROW_ADR_B [0:$2^N$–1] of the port B. For example, when the decoded row address DEC_ROW_ADR_A [0:$2^N$–1] of the port A is [0 . . . 10] (only the bit [1] of the DEC_ROW_ADR_A [0:$2^N$–1] is at the high logical value 1'b1) and the decoded row address DEC_ROW_ADR_B [0:$2^N$–1] of the port B is [0 . . . 10] (only the bit [1] of the DEC_ROW_ADR_B [0:$2^N$–1] is at the high logical value 1'b1), the gates of transistors 602_1 and 604_1 are logically high, and the transistor 602_1 and 604_1 are turned on.

Figure 7:
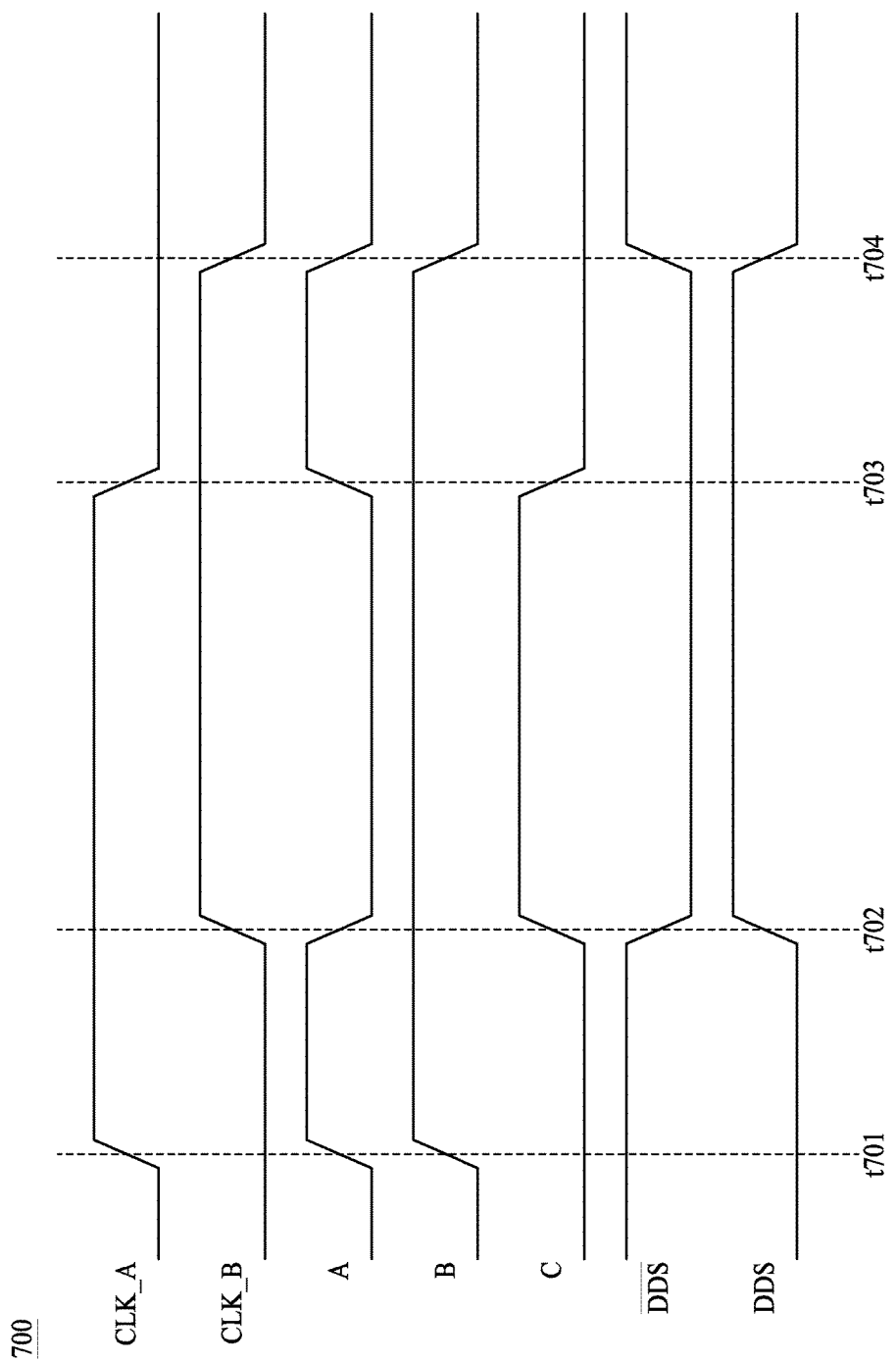
FIG. 7 is a diagram of waveforms illustrating operations of the disturb detector in FIG. 6, in accordance with some embodiments of the present disclosure.

The disturb detector 302 further includes an XOR-type gate 618, an OR-type gate 620 and an AND-type gate 622. The XOR-type gate 618 is used to generate an output signal A representative of an exclusive OR-type function of the received internal clocks CLK_A and CLK_B. The OR-type gate 620 is used to generate an output signal B representative of an OR-type function of the received internal clocks CLK_A and CLK_B. The AND-type gate 622 is used to generate an output signal C representative of an AND-type function of the received internal clocks CLK_A and CLK_B. Please refer to FIG. 7 in conjunction with FIG. 6. FIG. 7 is a diagram of waveforms 700 illustrating operations of the disturb detector 302 in FIG. 6, in accordance with some embodiments of the present disclosure. As shown in FIG. 7, the internal clock CLK_A is activated at time t701 and deactivated at time t703. The internal clock CLK_B is activated at time t702 and deactivated at time t704. Please note that the ports A and B of the dual port memory cell 100 are independent data ports that enable a read or a write operation on each port to addresses asynchronously from each other. Therefore the internal clocks CLK_A and CLK_B may be activated at different points in time, and the internal clocks CLK_A and CLK_B may be deactivated at different points in time as well.

The signal B is asserted to the high logical value 1'b1 when either one of the internal clocks CLK_A and CLK_B is activated. The signal B is coupled to a gate of a PMOS transistor 606. The PMOS transistor 606 includes a source coupled to the reference voltage VDD. A drain of PMOS transistor 606 is representative of a signal $\overline{DDS}$ which is a logically inverted signal of the disturb detected signal DDS. That is, the disturb detected signal DDS is an inverted signal of the signal $\overline{DDS}$ by an inverter 624. When both of the internal clocks CLK_A and CLK_B are deactivated, the PMOS transistor 606 is turned on to pull the signal $\overline{DDS}$ to the high logical value 1'b1. Equivalently, the disturb detected signal DDS is forced to be deasserted when both of the internal clocks CLK_A and CLK_B are deactivated.

The AND-type gate 622 is used to generate an output signal C representative of an AND-type function of the received internal clocks CLK_A and CLK_B. The signal C is asserted to the high logical value 1'b1 when both of the internal clocks CLK_A and CLK_B are activated. The signal C is coupled to a gate of an NMOS transistor 608. The NMOS transistor 608 includes a source coupled to the address comparator 601. To put it more specific, the source of the NMOS transistor 608 is coupled to the drains of the NMOS transistors 602_0 to 602_$2^N$–1. A drain of NMOS transistor 608 is coupled to the drain of the PMOS transistor 606. When both of the internal clocks CLK_A and CLK_B are activated, the NMOS transistor 608 is turned on and the PMOS transistor 606 is turned off. The signal $\overline{DDS}$ is determined by the address comparator 601. When the decoded row address DEC_ROW_ADR_A [0:$2^N$–1] and the decoded row address DEC_ROW_ADR_B [0:$2^N$–1] are the same, the signal $\overline{DDS}$ is pulled low and the disturb detected signal DDS is asserted. When the decoded row address DEC_ROW_ADR_A [0:$2^N$–1] and the decoded row address DEC_ROW_ADR_B [0:$2^N$–1] are different, the signal $\overline{DDS}$ and the disturb detected signal DDS are remained unchanged, i.e. at the high logical value 1'b1 and low logical value 1'b0, respectively.

As can be learned from the above, when both of the internal clocks CLK_A and CLK_B are deactivated, the disturb detected signal DDS is forced to be deasserted. When both of the internal clocks CLK_A and CLK_B are activated, the disturb detected signal DDS is determined according to the address comparator 601. Therefore, the disturb detector 302 further includes a DDS keeper 630 to allow the disturb detected signal DDS to remain its logical value at when the internal clocks CLK_A and CLK_B are one activated and the other deactivated.

The XOR-type gate 618 is used to generate an output signal A representative of an XOR-type function of the received internal clocks CLK_A and CLK_B. The signal A is asserted to the high logical value 1'b1 when one of the internal clocks CLK_A and CLK_B is activated and the other is deactivated. The signal A is coupled to a gate of an NMOS transistor 616 of the DDS keeper 630. An inverted signal A obtained through an inverter 626 is coupled to a gate of a PMOS transistor 610 of the DDS keeper 630. The DDS keeper 630 further includes an NMOS transistor 614 and a PMOS transistor 612. A source of the PMOS transistor 610 is coupled to the reference voltage VDD. A drain of the PMOS transistor 610 is coupled to a source of the PMOS transistor 612. A gate of the PMOS transistor 612 is coupled to a drain of the NMOS transistor 614 and an input of the inverter 624. A source of the NMOS transistor 616 is coupled to the reference voltage VSS. A drain of the NMOS transistor 616 is coupled to a source of the NMOS transistor 614. A gate of the PMOS transistor 612 and a gate of the NMOS transistor 614 are coupled to an output of the inverter 624. The output of the inverter 624 is representative of the disturb detected signal DDS.

Between timepoints t701 and t702, the DDS keeper 630 allows the disturb detected signal DDS to keep the logical value the same to the logical value of the disturb detected signal DDS right before the timepoint t701. Similarly, between timepoints t703 and t704, the DDS keeper 630 allows the disturb detected signal DDS to keep the logical value the same to the logical value of the disturb detected signal DDS right before the timepoint t703.

Write Assistor

Figure 8:
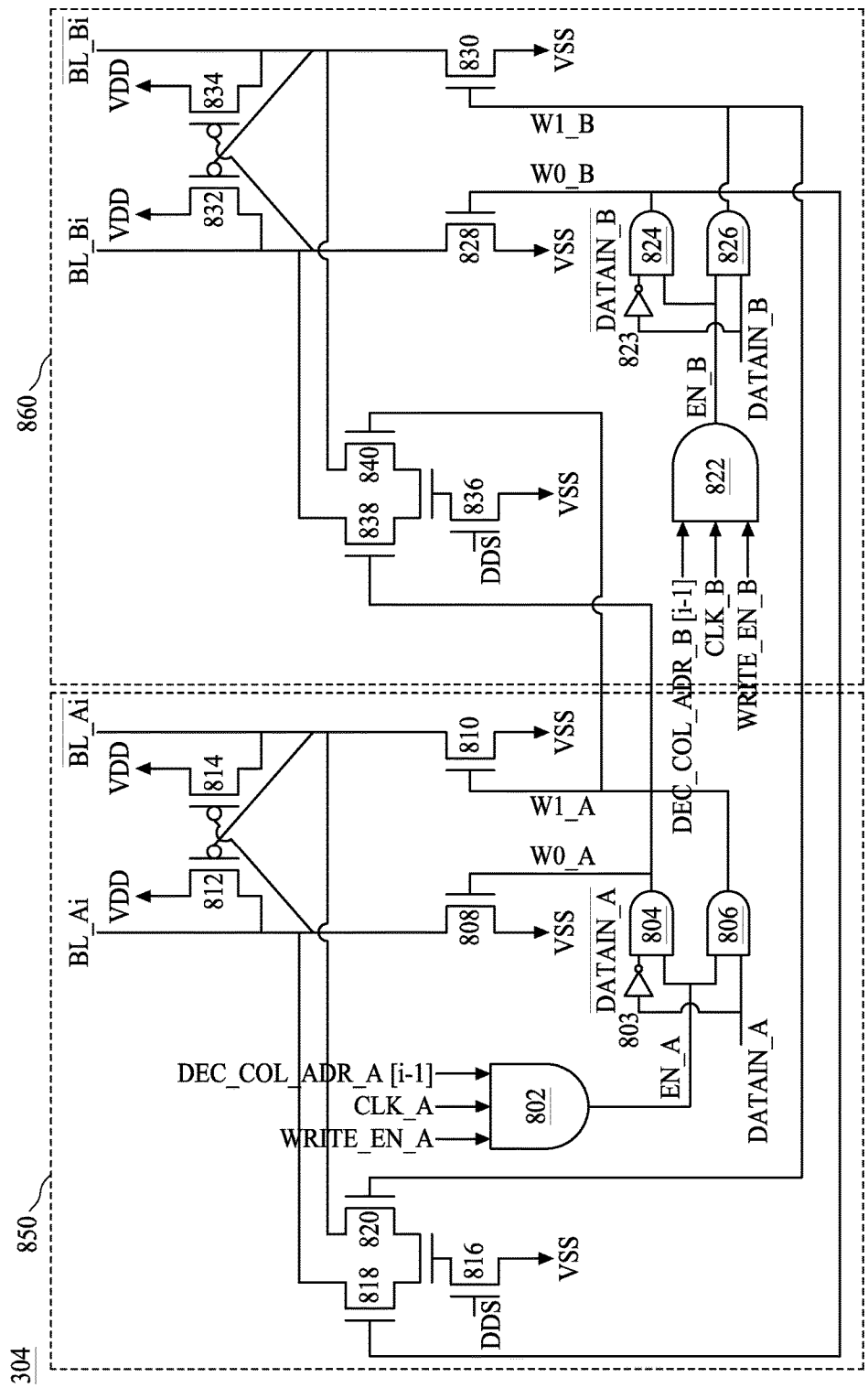
FIG. 8 is a diagram of the write assistor with a detailed structure in accordance with some embodiments of the present disclosure.

FIG. 8 is a diagram of the write assistor 304 with a detailed structure in accordance with some embodiments of the present disclosure. As described, the write assistor 304 is able to perform the write operation at both ports (i.e. port A and pot B) of the dual port memory cell 100 located at the $i_{th}$ column and the $j_{th}$ row when a write disturb takes place (i.e. the disturb detected signal DDS is asserted). Each dual port memory cell 100 in the memory array 200 requires a corresponding write assistor 304 respectively. Reference voltages VDD and VSS provide the power needed for the operation of the write assistor 304 and the dual port memory cells 100. As is known in the art, the reference voltage VDD is higher than the reference voltage VSS. The reference voltage VSS, which, in some embodiments, is ground.

The write assistor 304 includes a port A write assistor 850 and a port B write assistor 860. The port A write assistor 850 and the port B write assistor 860 may have the same structure as shown in FIG. 8. The port A write assistor 850 is used for controlling the bit lines BL_A$_i$ and $\overline{BL\_A_i}$ according to port A's input data DATAIN_A when it is requested to write the input data DATAIN_A into the port A of the dual port memory cell 100 located at the i$_{th}$ column and the j$_{th}$ row. The port A write assistor 850 is also used for controlling the bit lines BL_A$_i$ and $\overline{BL\_A_i}$ according to port B's input data DATAIN_B when the disturb detected signal DDS is asserted and it is requested to write the input data DATAIN_B into the port B of the dual port memory cell 100 located at the i$_{th}$ column and the j$_{th}$ row. Similarly, the port B write assistor 860 is used for controlling the bit lines BL_B$_i$ and $\overline{BL\_B_i}$ according to port B's input data DATAIN_B when it is requested to write the input data DATAIN_B into the port B of the dual port memory cell 100 located at the i$_{th}$ column and the j$_{th}$ row. The port B write assistor 860 is also used for controlling the bit lines BL_B$_i$ and $\overline{BL\_B_i}$ according to port A's input data DATAIN_A when the disturb detected signal DDS is asserted and it is requested to write the input data DATAIN_A into the port A of the dual port memory cell 100 located at the i$_{th}$ column and the j$_{th}$ row.

The port A write assistor 850 includes an AND-type gate 802 used to generate an output signal EN_A representative of an AND-type function of the received signals WRITE_EN_A, CLK_A and DEC_COL_ADR_A [i−1]. The write enable signal WRITE_EN_A is asserted (e.g., to a high logical value 1'b1 in the embodiment) when a write operation is requested for the port A. The decoded column address DEC_COL_ADR_A [i−1] comes from the M to $2^M$ decoder 500 for indicating a request for access the port A of the dual port memory cell 100 located at the i$_{th}$ column. The signal EN_A is asserted when the signals WRITE_EN_A, CLK_A and DEC_COL_ADR_A [i−1] are all activated. The signal EN_A and the input data DATAIN_A of port A are coupled to input terminals of an AND-type gate 806. The signal EN_A and an inverted input data $\overline{DATAIN\_A}$ of port A are coupled to input terminals of an AND-type gate 804. The inverted input data $\overline{DATAIN\_A}$ may be directly input from outside or may be obtained through an inverter 803. An output W0_A of the AND-type gate 804 is asserted when the input data DATAIN_A has a low logical value 1'b0 and the signal EN_A is asserted. An output W1_A of the AND-type gate 806 is asserted when the input data DATAIN_A has a high logical value 1'b1 and the signal EN_A is asserted.

The signals W0_A and W1_A are used to pull the bit lines BL_A$_i$ and $\overline{BL\_A_i}$ to the reference voltage VSS (the low logical value 1'b0) through NMOSs 808 and 810 respectively. Please note that the signals W0_A or W1_A may be asserted only when a write operation is requested to be performed upon the port A. Only one of the signals W0_A and W1_A may be asserted at a time. When one of the bit lines BL_A$_i$ and $\overline{BL\_A_i}$ is pulled to the reference voltage VSS (the low logical value 1'b0), the other one of the bit lines BL_A$_i$ and $\overline{BL\_A_i}$ is pulled to the reference voltage VDD (the high logical value 1'b1) through a corresponding PMOS 812 or 814.

The bit lines BL_A$_i$ and $\overline{BL\_A_i}$ may be further controlled by signals W0_B and W1_B coming from the port B write assistor 860 when the disturb detected signal DDS is asserted. The disturb detected signal DDS is coupled to a gate of an NMOS 816. The signals W0_B and W1_B coming from the port B write assistor 860 are coupled to NMOSs 818 and 820, respectively. When the disturb detected signal DDS is asserted, the NMOS 816 is turned on and one of the bit lines BL_A$_i$ and $\overline{BL\_A_i}$ may be pulled to the reference voltage VSS (the low logical value 1'b0) according to the signals W0_B and W1_B coming from the port B write assistor 860. Details of the port B write assistor 860 are the same or similar to the port A write assistor 850 and are not repeated here for brevity.

Figure 9:
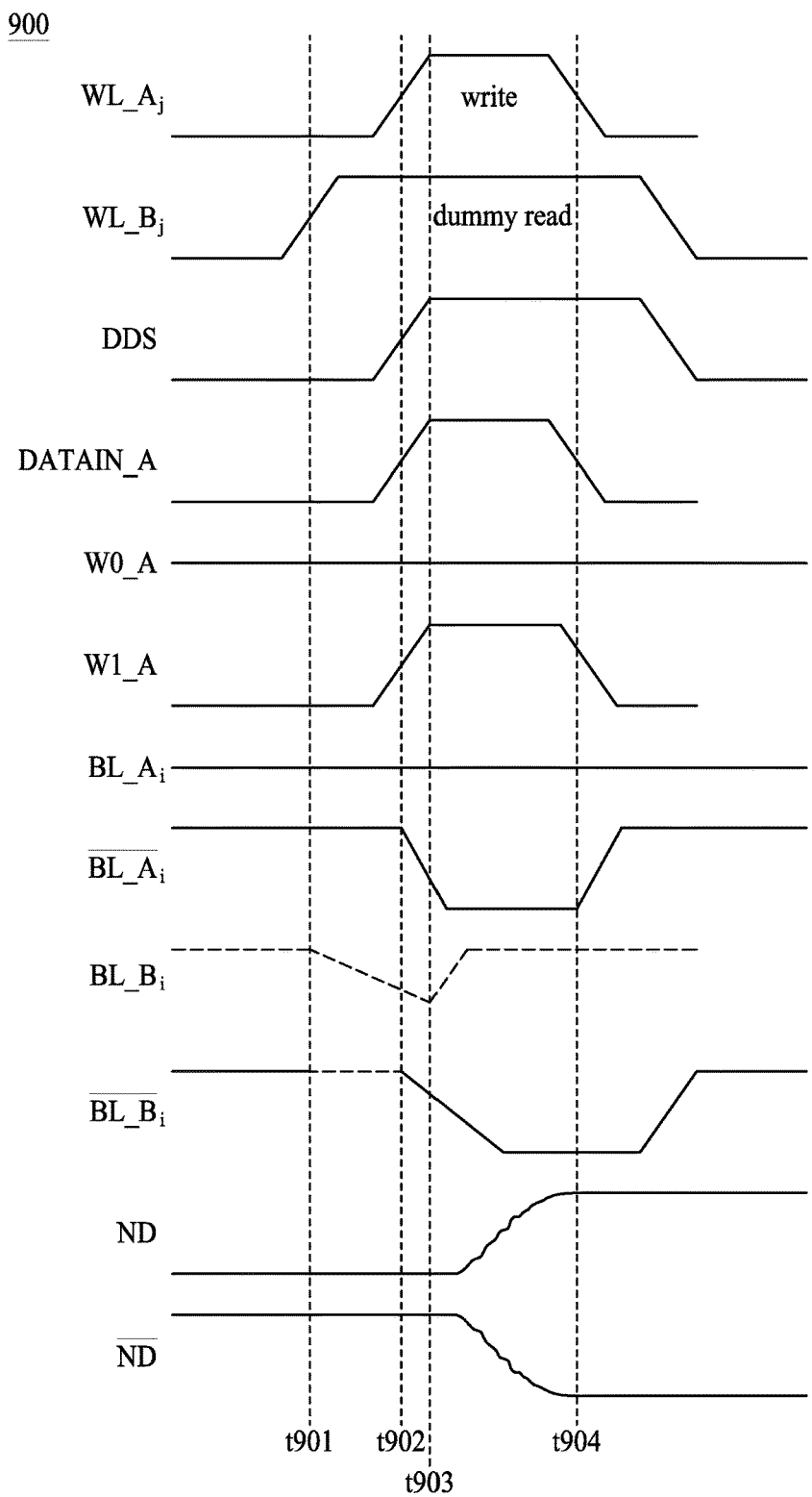
FIG. 9 is a diagram of waveforms illustrating operations of the write assistor in FIG. 8, in accordance with some embodiments of the present disclosure.

Please refer to FIG. 9 in conjunction with FIG. 3 and FIG. 8. FIG. 9 is a diagram of waveforms 900 illustrating operations of the write assistor 304 in FIG. 8, in accordance with some embodiments of the present disclosure. At timepoint t901, the word line WL_B$_j$ (shown in FIG. 3) is asserted due to the same row (the j$_{th}$ row) access event and the dummy read occurs on the port B of the dual port memory cell 100 located at the i$_{th}$ column and the j$_{th}$ row. In this case, the data stored in the storage area STRG at the timepoint t901 is 1'b0. The dummy read causes the bit line BL_B$_i$ to reflect the data stored in the storage area STRG. Therefore the bit line BL_B$_i$ starts to discharge and the voltage level falls at the timepoint t901.

At timepoint t902, the word line WL_A$_j$ (shown in FIG. 3) is asserted due to a write operation is requested to be performed upon the port A. Therefore the disturb detected signal DDS is asserted. The input data DATAIN_A is 1'b1, and the write operation intends to change the value of the data stored in the storage area STRG from 1'b0 to 1'b1. Therefore, the signal W1_A is activated after triggered by the input data DATAIN_A. Please note that waveforms of the decoded column address DEC_COL_ADR_A [i−1], the internal clock CLK_A, the write enable signal WRITE_EN, the signal EN_A are omitted in FIG. 9 for conciseness.

The signal W1_A turns on the NMOS 810 and pulls down the bit line $\overline{BL\_A_i}$ of the port A. In addition, the signal W1_A further turns on the NMOS 840 and pulls down the bit line $\overline{BL\_B_i}$ of the port B. When the voltage level of the bit line $\overline{BL\_B_i}$ of the port B drops to below VDD-Vtp, where Vtp is a threshold voltage of a PMOS 834 for pulling up the the bit line $\overline{BL\_B_i}$ of the port B, the bit line $\overline{BL\_B_i}$ is then pulled up again by a PMOS 832 having a gate coupled to the bit line BL_B, at the timepoint t903. By performing the write operation through both ports of the dual port memory cell 100 during the write disturb situation, the value of the storage nodes ND and $\overline{ND}$ can be changed more efficiently to reflect the write operation before the timepoint t904.

Some embodiment of the present disclosure provides a memory array having a first port and a second port. The memory array includes: a first memory cell, wherein access to the first memory cell through the first port is controlled by a first word line, and access to the first memory cell through the second port is controlled by a second word line; a second memory cell, wherein access to the second memory cell through the first port is controlled by the first word line, and access to the second memory cell through the second port is controlled by the second word line; and a disturb detector, used to generate a disturb detected signal for indicating whether the first memory cell and the second memory cell are accessed at a same time.

Some embodiment of the present disclosure provides a memory array having a first port and a second port. The memory array includes: a first word line, corresponding to the first port; a second word line, corresponding to the second port; a first bit line; a second bit line, wherein the second bit line is a logically inverted signal of the first bit line, and the first bit line and the second bit line correspond to the first port; a third bit line; a fourth bit line, wherein the fourth bit line is a logically inverted signal of the third bit line, and the third bit line and the fourth bit line correspond to the second port; a write assistor coupled to the first bit line, the second bit line, the third bit line, and the fourth bit line; and a dual port memory cell, wherein a connection between the dual port memory cell and the first bit line and the second bit line is controlled by the first word line, and a connection between the dual port memory cell and the third bit line and the fourth bit line is controlled by the second word line.

Some embodiment of the present disclosure provides a memory array having a first port and a second port. The memory array includes: a first word line, corresponding to the first port; a second word line, corresponding to the second port; a first bit line; a second bit line, wherein the second bit line is a logically inverted signal of the first bit line, and the first bit line and the second bit line correspond to the first port; a third bit line; a fourth bit line, wherein the fourth bit line is a logically inverted signal of the third bit line, and the third bit line and the fourth bit line correspond to the second port; a dual port memory cell, wherein a connection between the dual port memory cell and the first bit line and the second bit line is controlled by the first word line, and a connection between the dual port memory cell and the third bit line and the fourth bit line is controlled by the second word line; and a write assistor including a first portion and the second portion; wherein when a write disturb caused by the second port to the first port is detected, the first portion of the write assistor controls the first bit line, the second bit line, third bit line and the fourth bit line according to a data required to be written into the memory cell through the first port; and wherein when a write disturb caused by the first port to the second port is detected, the second portion of the write assistor controls the first bit line, the second bit line, third bit line and the fourth bit line according to a data required to be written into the memory cell through the second port.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory array having a first port and a second port, the memory array comprising:
    a first memory cell, wherein access to the first memory cell through the first port is controlled by a first word line, and access to the first memory cell through the second port is controlled by a second word line;
    a second memory cell, wherein access to the second memory cell through the first port is controlled by the first word line, and access to the second memory cell through the second port is controlled by the second word line; and
    a disturb detector, configured to generate a disturb detected signal according to an internal clock of the first port and an internal clock of the second port for indicating whether the first memory cell and the second memory cell are accessed at a same time;
    wherein the disturb detector includes a signal keeper to allow a logical value of the disturb detected signal to be remained when the internal clock of the first port is activated and the internal clock of the second port is deactivated.

2. The memory array of claim 1, wherein the disturb detector generates the disturb detected signal according to a received decoded row address of the first port and a received decoded row address of the second port.

3. The memory array of claim 2, wherein the disturb detector includes an address comparator for determining whether the received decoded row address of the first port and the received decoded row address of the second port are the same.

4. The memory array of claim 1, wherein the disturb detector includes an AND-type gate representative of an AND-type function of the internal clock of the first port and the internal clock of the second port.

5. The memory array of claim 1, wherein the disturb detector includes an OR-type gate representative of an OR-type function of the internal clock of the first port and the internal clock of the second port.

6. The memory array of claim 1, wherein the disturb detector includes an XOR-type gate representative of an XOR-type function of the internal clock of the first port and the internal clock of the second port.

7. A memory array having a first port and a second port, the memory array comprising:
    a first word line, corresponding to the first port;
    a second word line, corresponding to the second port;
    a first bit line;
    a second bit line, wherein the second bit line is a logically inverted signal of the first bit line, and the first bit line and the second bit line correspond to the first port;
    a third bit line;
    a fourth bit line, wherein the fourth bit line is a logically inverted signal of the third bit line, and the third bit line and the fourth bit line correspond to the second port;
    a write assistor coupled to the first bit line, the second bit line, the third bit line, and the fourth bit line; and
    a dual port memory cell, wherein a connection between the dual port memory cell and the first bit line and the second bit line is controlled by the first word line, and a connection between the dual port memory cell and the third bit line and the fourth bit line is controlled by the second word line;
    wherein the write assistor includes a first portion corresponding to the first port, and the first portion of the write assistor controls the first bit line and the second bit line according to a received write enable signal of the first port, an internal clock of the first port, and a received decoded column address of the first port.

8. The memory array of claim 7, wherein the write assistor further includes a second portion corresponding to the second port.

9. The memory array of claim 8, wherein the first portion of the write assistor includes a first AND-type gate representative of an AND-type function of the received write enable signal of the first port, the internal clock of the first port, and the received decoded column address of the first port.

10. The memory array of claim 9, wherein the first portion of the write assistor further includes a second AND-type gate representative of an AND-type function of an output of the first AND-type gate and a data required to be written into the memory cell through the first port.

11. The memory array of claim 10, wherein the first portion of the write assistor further includes a first transistor coupled between the second bit line and a reference voltage, and a gate of the first transistor of the first portion of the write assistor is controlled by an output of the second AND-type gate of the first portion of the write assistor.

12. The memory array of claim 11, wherein the second portion of the write assistor controls the third bit line and the fourth bit line according to a received write enable signal of the second port, an internal clock of the second port, and a received decoded column address of the second port.

13. The memory array of claim 12, wherein the second portion of the write assistor includes a first AND-type gate representative of an AND-type function of the received write enable signal of the second port, the internal clock of the second port, and the received decoded column address of the second port.

14. The memory array of claim 13, wherein the second portion of the write assistor further includes a second AND-type gate representative of an AND-type function of an output of the second AND-type gate and a data required to be written into the memory cell through the second port.

15. The memory array of claim 14, wherein the second portion of the write assistor further includes a first transistor coupled between the fourth bit line and the reference voltage, and a gate of the first transistor of the second portion of the write assistor is controlled by an output of the second AND-type gate of the second portion of the write assistor.

16. The memory array of claim 15, wherein the first portion of the write assistor further includes a second transistor coupled between the second bit line and the reference voltage, and a gate of the second transistor of the first portion of the write assistor is controlled by an output of the second AND-type gate of the second portion of the write assistor.

17. A memory array having a first port and a second port, the memory array comprising:
a first word line, corresponding to the first port;
a second word line, corresponding to the second port;
a first bit line;
a second bit line, wherein the second bit line is a logically inverted signal of the first bit line, and the first bit line and the second bit line correspond to the first port;
a third bit line;
a fourth bit line, wherein the fourth bit line is a logically inverted signal of the third bit line, and the third bit line and the fourth bit line correspond to the second port;
a dual port memory cell, wherein a connection between the dual port memory cell and the first bit line and the second bit line is controlled by the first word line, and a connection between the dual port memory cell and the third bit line and the fourth bit line is controlled by the second word line; and
a write assistor including a first portion and the second portion;
wherein when a write disturb caused by the second port to the first port is detected, the first portion of the write assistor controls the first bit line, the second bit line, third bit line and the fourth bit line according to a data required to be written into the memory cell through the first port; and
wherein when a write disturb caused by the first port to the second port is detected, the second portion of the write assistor controls the first bit line, the second bit line, third bit line and the fourth bit line according to a data required to be written into the memory cell through the second port.

18. The memory array of claim 17, wherein the first portion of the write assistor controls the first bit line, the second bit line, third bit line and the fourth bit line according to a received write enable signal of the first port, an internal clock of the first port, and a received decoded column address of the first port.

19. The memory array of claim 18, wherein the first portion of the write assistor includes a first AND-type gate representative of an AND-type function of the received write enable signal of the first port, the internal clock of the first port, and the received decoded column address of the first port.

20. The memory array of claim 19, wherein the first portion of the write assistor further includes a second AND-type gate representative of an AND-type function of an output of the first AND-type gate and a data required to be written into the memory cell through the first port.

* * * * *